(12) United States Patent
Gajadharsing

(10) Patent No.: US 8,928,402 B2
(45) Date of Patent: Jan. 6, 2015

(54) N WAY DOHERTY AMPLIFIER

(71) Applicant: NXP B.V., Eindhoven (NL)

(72) Inventor: Radjindrepersad Gajadharsing, Beuningen (NL)

(73) Assignee: NXP, B.V., Eindhoven (NL)

( * ) Notice: Subject to any disclaimer, the term of this patent is extended or adjusted under 35 U.S.C. 154(b) by 100 days.

(21) Appl. No.: 13/693,537

(22) Filed: Dec. 4, 2012

(65) Prior Publication Data

US 2013/0154731 A1 Jun. 20, 2013

(30) Foreign Application Priority Data

Dec. 20, 2011 (EP) ..................... 11194463

(51) Int. Cl.
*H03F 3/68* (2006.01)
*H03F 1/02* (2006.01)
(52) U.S. Cl.
CPC ............... *H03F 3/68* (2013.01); *H03F 1/0294* (2013.01); *H03F 1/0288* (2013.01); *H03F 2200/405* (2013.01)
USPC ..................... 330/124 R; 330/295
(58) Field of Classification Search
USPC ................ 330/252–261
See application file for complete search history.

(56) References Cited

U.S. PATENT DOCUMENTS

| 5,025,225 | A | 6/1991 | Tajima et al. | |
|---|---|---|---|---|
| 8,339,201 | B1 * | 12/2012 | Wilson et al. | 330/295 |
| 2005/0134377 | A1 | 6/2005 | Dent | |
| 2009/0295473 | A1 | 12/2009 | Dupuy et al. | |

FOREIGN PATENT DOCUMENTS

| EP | 1 677 414 A1 | 7/2006 |
|---|---|---|
| WO | 2005/031967 A1 | 4/2005 |
| WO | 2009/081341 A1 | 7/2009 |

OTHER PUBLICATIONS

Yang, Y. et al. "A Fully Matched N-Way Doherty Amplifier with Optimized Linearity", IEEE Trans. on Microwave Theory and Techniques, vol. 51, No. 3, pp. 986-993 (2003).
Cho, K.J. et al "Design of N-Way Distributed Doherty Amplifier for WCDMA and OFDM Applications", Electronics Letters, vol. 43, No. 10, pp. 577-579 (May 2007).
Cho, K.J. et al "N-Way Distributed Doherty Amplifier with an Extended Efficiency Range", Microwave Symp., 2007 IEEE/MTT-S Int'l. Microwave Symp., pp. 1581-1584 (Jun. 2007).
Elmala, M. et al. "A 90nm CMOS Doherty Power Amplifier with Integrated Hybrid Coupler and Impedance Transformer", IEEE Radio Frequency Integrated Circuits Symp., pp. 423-426 (Jun. 2007).

(Continued)

*Primary Examiner* — Hieu Nguyen

(57) ABSTRACT

A device including a Doherty amplifier, the Doherty amplifier having an amplifier input and output. At least one main amplifier is coupled to the input via a main input impedance and to the output via a main output impedance and additional amplifiers, each amplifier being coupled to the input via respective additional input impedances. Each additional amplifier has a respective additional amplifier output coupled to a respective pair of additional impedances connected in series and having a respective connection node between them. The device also has a first additional amplifier having their respective additional impedances coupled between its respective output and the amplifier output, the pair of additional impedances having first and second impedances, the first impedance being connected to the respective additional amplifier output and to the connection node, the second impedance being coupled between their respective connection node and the connection node of the previous additional amplifier.

4 Claims, 4 Drawing Sheets

(56) References Cited

OTHER PUBLICATIONS

Kim, I. et al. "Optimized Design of a Highly Efficient Three-Stage Doherty PA Using Gate Adaptation", IEEE Trans. on Microwave Theory and Techniques, vol. 58, No. 10, pp. 2562-2574 (Oct. 2010).

Grebennikov, A. "A High-Efficiency 100-W Four-Stage Doherty GaN HEMT Power Amplifier Module for WCDMA Systems", ARMMS Conference, retrieved from the Internet at: http://www.armms.org/media/uploads/1335467045.pdf, 10 pgs. (Apr. 2011).

Lee M.W. et al. "Design of Highly Efficient Three-Stage Inverted Doherty Power Amplifier", IEEE Microwave and Wireless Components Letters, vol. 21, No. 7, pp. 383-385 (Jul. 2011).

Juschke, P. et al. "Multiband Doherty RF Power Amplifier", IEEE Africon 2011, 4 pgs. (Sep. 2011).

Extended European Search Report for European Patent Appln. No. 11194463.3 (Oct. 24, 2012).

\* cited by examiner

N WAY DOHERTY AMPLIFIER

CROSS-REFERENCE TO RELATED APPLICATIONS

This application claims the priority under 35 U.S.C. §119 of European patent application no. 11194463.3, filed on Dec. 20, 2011, the contents of which are incorporated by reference herein.

FIELD OF THE INVENTION

The invention relates to an N way Doherty amplifier.

BACKGROUND OF THE INVENTION

Doherty type amplifiers are widely used for power amplifiers in wireless communications due to their higher efficiency when handling variable power levels, which are common in multi-carrier wireless communications systems. Doherty amplifiers comprise a main amplifier and a peak amplifier, the main amplifier handling power levels up to a threshold point with high efficiency and the peak amplifier handling power levels above the threshold point. Together, the main and peak amplifiers, which typically operate according to different classes, can deliver an improved efficiency compared with a similarly rated single stage amplifier.

WO2009081341A1 describes a 3-way Doherty amplifier architecture. It enables high efficiency over large dynamic range without suffering from load-line modulation disruption as in the conventional case and as a result enabling the use of simple passive splitters.

An important advantage of this architecture is that, contrary to the conventional case, high efficiency over a large dynamic range can be attained if the total power is commensurately (1:1:1) distributed over the three branches. Utilizing the same transistor type in each branch is beneficial in terms of amplifier yield in mass production.

However, the above-mentioned Doherty amplifier has a number of limitations when it comes to further enhancing the efficiency, increasing the peak power capability and reducing size and cost.

We may summarize the main drawbacks of the cited amplifier as:
  The demand for ever increasing efficiency necessitates incommensurate distribution of the total power over the three branches which forces the use of at least two transistor types. Good yield and performance consistency in mass production may then require complicated device selection and pairing procedures. This will have a detrimental effect on the production yield of the transistors. With this approach significant improvement of the average efficiency can only be realized for complex modulated signals that have larger peak-to-average-ratios then contemporary signals.
  Meeting the ever increasing peak power demands from the market require very high peak power devices which suffer from low impedance and performance degradation due to power scaling effects. This makes achieving good performance at high peak powers in a 3-way Doherty difficult.
  The continuous push from the market to reduce size and cost with higher performance are difficult to realize in the three-way Doherty approach.
    1. E.g., integrating two devices in a dual package with extremely high peak powers is beyond the capability of current technologies.
    2. Integrated dual MMIC drivers require complicated asymmetrical power configurations to drive the main and the two peaks.
    3. Three-way asymmetrical input splitters in stripline technology consume a lot of PCB real estate and alternatives with standard quadrature hybrids are very difficult.

SUMMARY OF THE INVENTION

Hence, there is a need for an improved Doherty amplifier which is better adapted to the market needs.
  1. It is therefore an object of the invention to provide a device including a Doherty amplifier, the Doherty amplifier comprising,
    an amplifier input and an amplifier output;
      at least one main amplifier coupled to the amplifier input via a main input impedance and further coupled to the amplifier output via a main output impedance;
      a plurality of additional amplifiers, each amplifier being coupled to the input via respective additional input impedances,
      each additional amplifier comprising a respective additional amplifier output coupled to a respective pair of additional impedances connected in series and having a respective connection node between them,
      a first additional amplifier having their respective additional impedances coupled between its respective output and the amplifier output,
      the pair of additional impedances having a first impedance and a second impedance, the first impedance being connected to the respective additional amplifier output and to the connection node, the second impedance being coupled between their respective connection node and the connection node of the previous additional amplifier.

Preferably, the device comprises more than 3 amplifiers.

In an embodiment, the additional input impedances implements a respective additional phase shift, each specific one of the additional phase shifts for a specific one of the additional amplifiers being larger by 90° than the additional phase shift of a previous one of the additional amplifiers stages in the device, the additional amplifiers being indexed by the natural numbers from 2 to n.

In another embodiment of the invention the device further comprises a first phase splitter coupled to the input and generating two first splitter output signals in quadrature with each other, each of the first splitter outputs being further connected to a respective further phase splitter, which are functionally analogous to the first phase splitter, each output of the further phase splitters being coupled to the respective inputs of the main amplifier and the additional amplifiers.

Advantageously, the first phase splitter in coupled to the respective further phase splitters via a respective dual driver.

The invention is defined by the independent claims. Dependent claims define advantageous embodiments.

BRIEF DESCRIPTION OF THE DRAWINGS

The above and other advantages will be apparent from the exemplary description of the accompanying drawings in which.

DETAILED DESCRIPTION OF EMBODIMENTS

Figure 1:
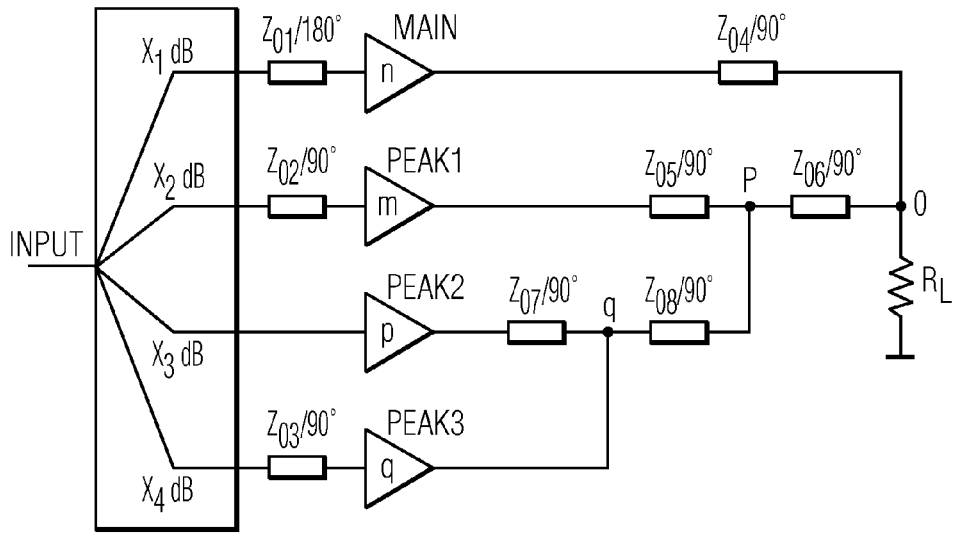
FIG. 1 depicts an embodiment of a 4 way Doherty amplifier according to the invention.

FIG. 1 depicts an embodiment of a 4 way Doherty amplifier according to the invention. The novel four-way Doherty amplifier utilizes an output combining circuit that enables undisrupted load-line modulation for all four amplifiers, see the figure below. The main amplifier is connected to the load $R_L$, node o, through a single impedance inverter $Z_{o4}$, i.e. an impedance which provides a 90 degree phase shift at the center frequency between a signal applied to an end and an output signal. The first peak amplifier is connected to the load via two cascaded impedance inverters $Z_{o5}$ and $Z_{o6}$ and introduce a first intermediate node p which accommodates connection of the second peak amplifier. The third peak amplifier is connected to this intermediate node p via two cascaded impedance inverter $Z_{o7}$ and $Z_{o8}$ and introduce a second intermediate node q which accommodates connection of the third peak amplifier.

Figure 2:
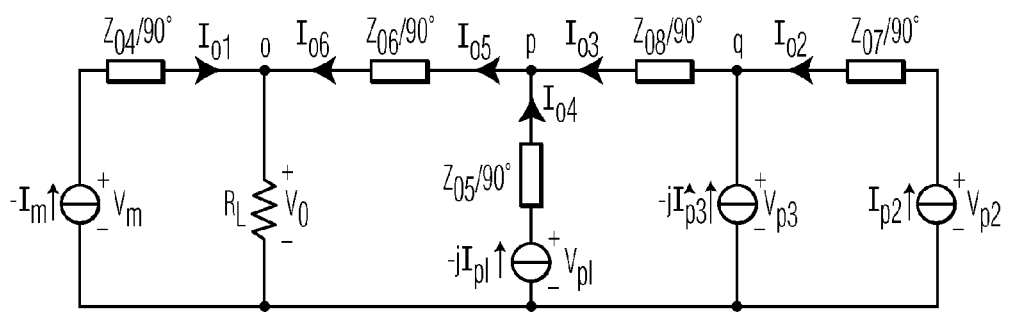
FIG. 2 depicts the principle circuit of the 4 way Doherty amplifier.
Figure 3A:
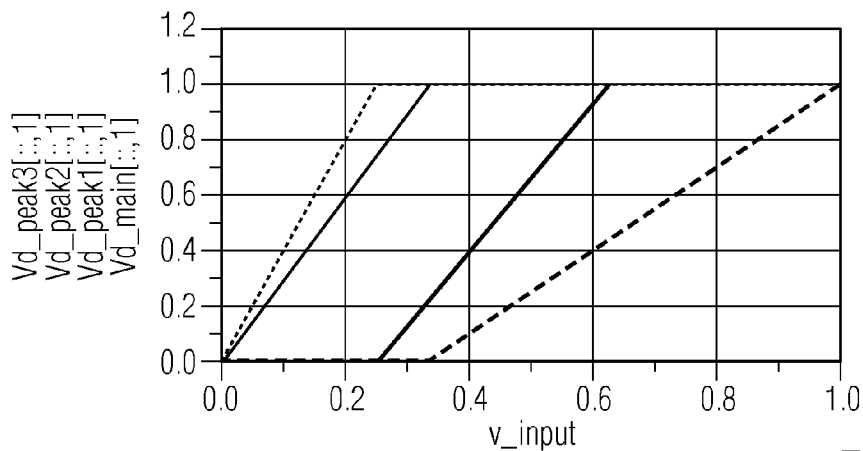
FIG. 3a, 3b depict the voltage and the respective current characteristics of the Doherty amplifier, according to the invention.
Figure 3B:
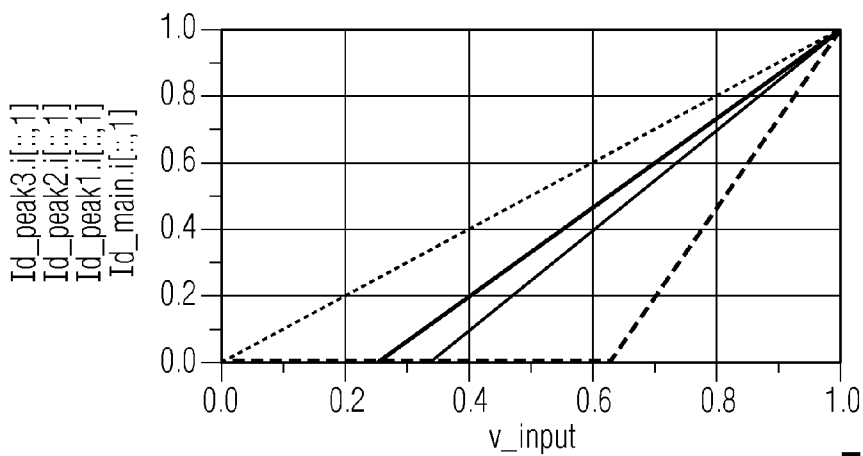

To maximize the power combining efficiency, the phase shift of each amplifier branch from the input to the combining point needs to be synchronized by introducing appropriate phase shifts at the inputs of the individual amplifiers as depicted in the FIG. 1. The principle circuit of the four-way Doherty amplifier and the voltage and current characteristics of the individual current sources are shown in FIGS. 2, 3a and 3b, respectively. The amplifier's operation can be divided into four regions:

Region 1: at low power levels, where the input power is less than the peak amplifiers' conduction threshold, the main amplifier is the only device supplying current to the load $R_L$. The impedance present at its output, due to the impedance inverter $Z_{o4}$, ensures that the main amplifier enters voltage saturation well below its maximum peak power capability. This results in the first maximum efficiency point in back-off.

Region 2: if the input power level exceeds the threshold of the first peak amplifier, it starts to deliver current to the load $R_L$, which adds in-phase with the main amplifier current at node o, increasing the RF output voltage on the load. Therefore the apparent impedance seen by the output of the impedance inverter $Z_{o4}$ is higher than the actual load $R_L$. Through this active load-pulling effect the impedance seen by the main amplifier output will decrease, due to the impedance inverter $Z_{o4}$, and its power contribution will increase further. The output power from both amplifiers will increase with increasing signal level until the first peak amplifier enters voltage saturation below its maximum peak power capability. This results in the second maximum efficiency point in back-off.

Region 3: if the input power level exceeds the threshold of the second peak amplifier, it starts to deliver current which first adds in-phase with the first peak amplifier current at node p resulting in an increasing RF voltage on node p. As a result the impedance seen by the first peak amplifier output will decrease, due to the impedance inverter $Z_{o5}$, and its power contribution will increase further. The increasing voltage at node p, will force the output voltage at node o and therefore the main amplifier current to increase. The output powers of all three amplifiers will increase with increasing signal level until the second peak amplifier enters voltage saturation below its peak power capability. This results in the third maximum efficiency point in back-off.

Region 4: if the input power level exceeds the threshold of the third peak amplifier, it starts to deliver current which adds in-phase with the second peak amplifier current at node q. This results in an increasing voltage at node q which will force the current of the second peak amplifier, the first peak amplifier and the main amplifier to increase further. The output powers of all four amplifiers will increase with increasing signal level until the third peak amplifier reaches maximum voltage and thus its peak power capability. This results in the fourth maximum efficiency point at the maximum output power capability of the total amplifier.

This N-way Doherty has an advantage w.r.t. the loss introduced by the off-state impedances of the peak amplifiers. Off-state impedances are not infinite for an practical devices.

In back-off state when all peak amplifiers are in off-state, only the off-state impedance of the first peak amplifier will have impact on the back-off efficiency of the Doherty amplifier.

The second and next peak amplifiers are connected to nodes which have very low impedance and therefore have negligible impact on the Doherty back-off efficiency. So, increasing the number of peak amplifiers will not decrease the efficiency proportionally like in the conventional case.

Figure 4:
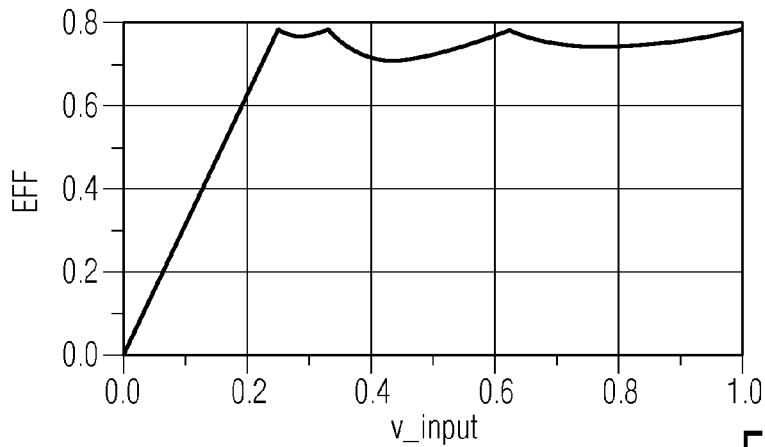
FIG. 4 depicts the instantaneous efficiency characteristic of the 4 way Doherty amplifier.

The four-way Doherty amplifier therefore exhibits four maximum efficiency points as it is shown in FIG. 4.

Figure 5:
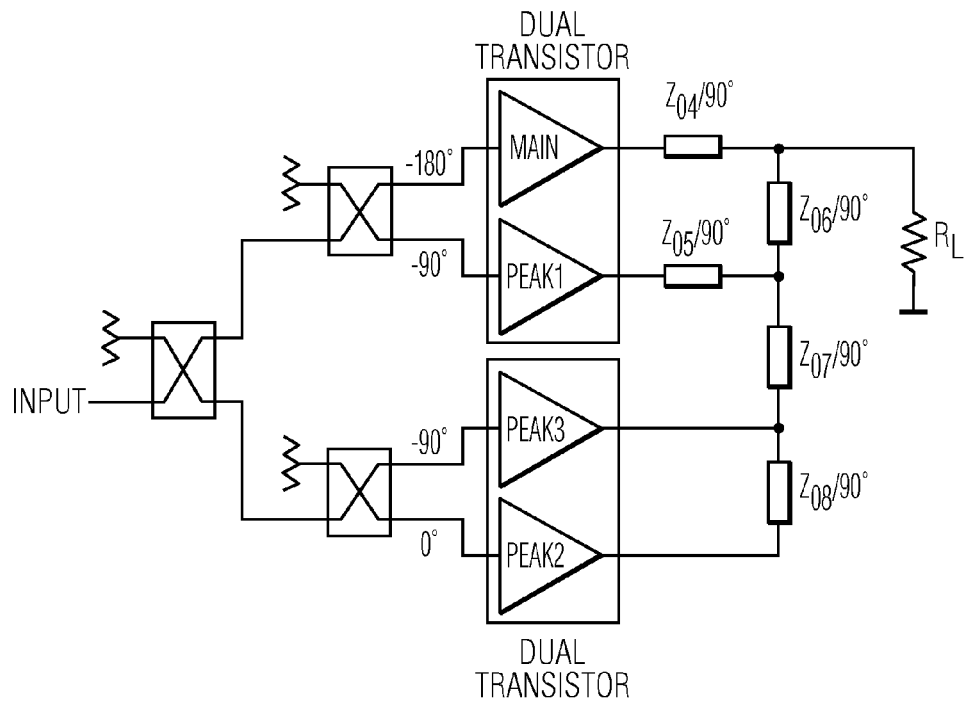
FIG. 5 depicts a more detail embodiment of a device comprising a Doherty amplifier, according to the invention.

FIG. 5 shows a basic configuration of the proposed solution including an input splitter architecture. All amplifiers operate from the same rail supply voltage and are biased in different classes. The main amplifier is commonly biased in class-AB, i.e. above threshold, to perform the linear amplification function for lower envelope signals. The peak amplifiers are biased in class-C, with differing bias offset voltages below threshold, to amplify the higher envelope signals. The devices are integrated in pairs into a dual transistor package, reducing the size and component count. The depicted arrangement of amplifiers and impedance inverters results in a layout of minimum size.

The input splitter utilizes quadrature couplers to generate the appropriate drive levels and the required phase shifts. The quadrature couplers can be either coupled line or branch line structures.

Figure 6:
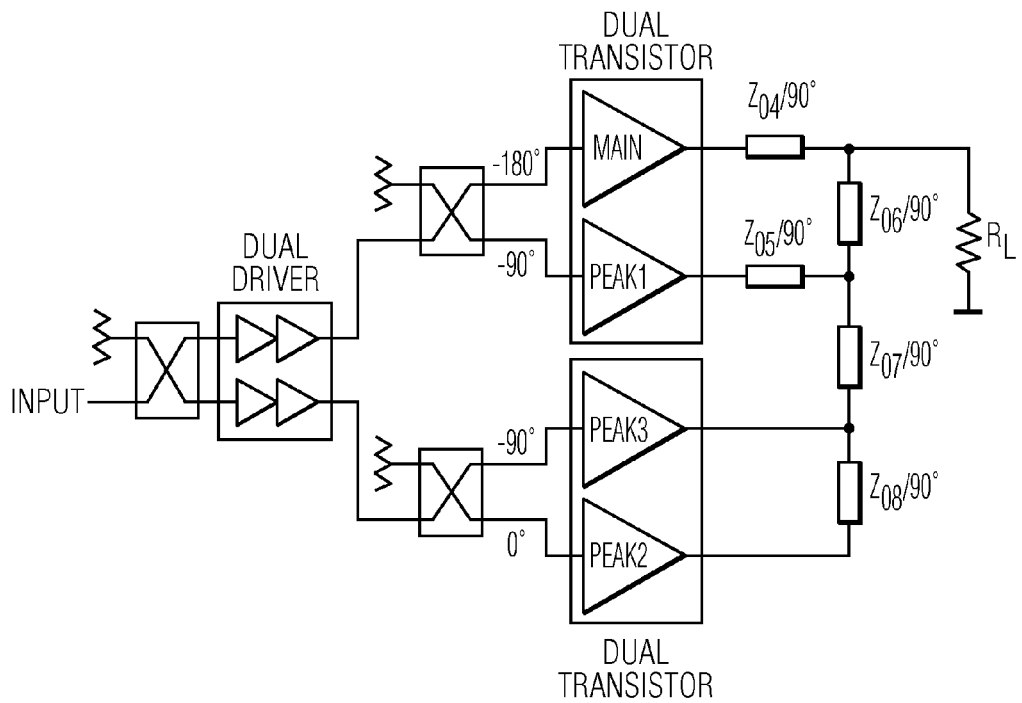
FIG. 6 depicts an even more detailed view of the device comprising a Doherty amplifier, according to the invention.

FIG. 6 shows an extension of the basic 4-way Doherty configuration with a dual driver configuration integrated in the input splitter. There are some advantages with this driver configuration:

1. The line up efficiency can be higher compared to the situation where one common driver is used at the input port. This is due to the extra flexibility to bias both sections of the dual driver differently.
2. Embedding the dual driver between the quadrature couplers results in interstage isolation, i.e. between the driver outputs and the inputs of the main and peak amplifiers. This eliminates the need for extra isolators which are commonly used in the interstage to improve performance consistency over the total line up.
3. The pre-driver stage is provided with a better load definition since the input quadrature hybrid provides isolation.

In the following tables, a way of designing the Doherty amplifier is presented.

One way to start the design of a four-way Doherty is to specify the locations of points maximum efficiency points $k_1$, $k_2$ and $k_3$ in backoff.

The ratio of maximum power capability per branch follows directly from:

$$P_{o\_mF}:P_{o\_p1F}:P_{o\_p2F}:P_{o\_p3F}=k_3:k_2(1-k_3):(1-k_2)(k_1-k_3):(1-k_1)(1-k_2)$$

Maximum Power Levels of Transistors are Given:

If the maximum power capability of the main, first peak, second peak and third peak amplifiers are given the back-off points can be calculated with the following relations:

TABLE 1

$$k_1 = \frac{P_{p2F} + \dfrac{P_{mF}P_{p3F}}{P_{mF}+P_{p3F}+P_{p2F}+P_{p1F}}}{P_{p2F}+P_{p3F}}$$

$$k_2 = \frac{P_{p1F}}{P_{p3F}+P_{p2F}+P_{p1F}}$$

$$k_3 = \frac{P_{mF}}{P_{mF}+P_{p3F}+P_{p2F}+P_{p1F}}$$

Characteristic Impedances of the Combiner:

To be able to determine the characteristic impedance ($Z_{0x}$) of the output transmission lines the designer needs to choose the load impedance ($R_{mF}$) for maximum power at the main PA port and the load impedance ($R_L$) at the output port.

With the selected values for $k_1$, $k_2$ and $k_3$, $Z_{0x}$ can be calculated with the following relations:

TABLE 2

$$Z_{04} = \sqrt{\frac{R_{mF}R_L}{k_3}}$$

$$Z_{05} = \frac{Z_{06}R_{mF}}{Z_{04}k_2}$$

$$Z_{06} = \frac{Z_{04}}{\dfrac{R_{mF}}{Z_{08}} + \dfrac{R_{mF}}{Z_{05}}}$$

$$Z_{07} = R_{mF}\frac{k_3}{(1-k_2)(k_1-k_3)}$$

$$Z_{08} = \frac{Z_{04}Z_{06}k_3}{R_L(1-k_2)}$$

Note that $Z_{05}$, $Z_{06}$ and $Z_{08}$ are dependant relations. This implies that the designer has one degree of freedom in the choice of these characterkic impedances The novel 4 way Doherty amplifier concept according to the invention has the following advantages over the 3 way Doherty amplifier of the prior art.

1. Enables maximum instantaneous efficiency points at 4 dB back-off, at 9.5 dB back-off and at 12 dB back-off with only a single device size resulting in higher average efficiency for signals with a Rayleigh PDF of different PAR's.
2. Since all four devices have the same power size they can be paired as dual transistors in a single package reducing the number of transistors to two. This benefits size and cost.
3. Enables easier way to reach very high peak powers.
4. The symmetry in the circuit enables simple passive splitters with the possibility to embed a symmetrical dual driver stage in it to obtain higher line-up efficiency.

Figure 7:
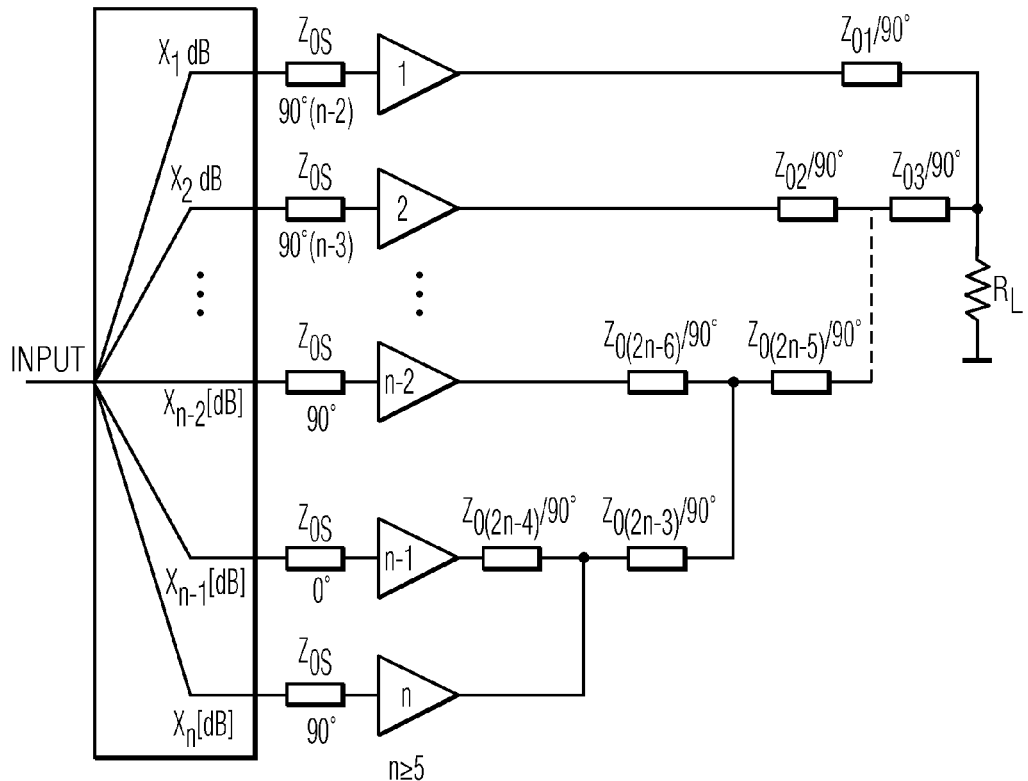
FIG. 7 depicts an n way Doherty amplifier, according to the invention.

The concept described above can be easily generalized as it in shown in FIG. 7.

The device including a Doherty amplifier, the Doherty amplifier comprising,
an amplifier input and an amplifier output
at least one main amplifier (1) coupled to the amplifier input via a main input impedance ($Z_{0s}/908(n-2)$) and further coupled to the amplifier output via a main output impedance ($Z_{01}/90$);
a plurality of additional amplifiers (2, 3, . . . , n), each amplifier being coupled to the input via respective additional input impedances ($Z_{0s}/908(n-3)$, . . . ),
each additional amplifier comprising a respective additional amplifier output coupled to a respective pair of additional impedances connected in series and having a respective connection node between them,
a first additional amplifier having their respective additional impedances coupled between its respective output and the amplifier output,
the pair of additional impedances having a first impedance and a second impedance, the first impedance being connected to the respective additional amplifier output and to the connection node, the second impedance being coupled between their respective connection node and the connection node of the previous additional amplifier.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A device including a Doherty amplifier, the Doherty amplifier comprising:
an amplifier input and an amplifier output
at least one main amplifier coupled to the amplifier input via a main input impedance and further coupled to the amplifier output via a main output impedance;
a plurality of additional amplifiers, each said amplifier being coupled to the input via respective additional input impedances,
each additional amplifier comprising a respective additional amplifier output coupled to a respective pair of additional impedances connected in series and having a respective connection node between them,
a first additional amplifier having their respective additional impedances coupled between its respective output and the amplifier output,
the pair of additional impedances having a first impedance and a second impedance, the first impedance being connected to the respective additional amplifier output and to the connection node, the second impedance being coupled between their respective connection node and the connection node of the previous additional amplifier;
further comprising a first phase splitter coupled to the input and generating two first splitter output signals in quadrature with each other, each of the first splitter outputs being further connected to a respective further phase splitter, which are functionally analogous to the first phase splitter, each output of the further phase splitters being coupled to the respective inputs of the main amplifier and the additional amplifiers.

2. A device as claimed in claim 1, wherein the number of the additional amplifiers exceeds 3.

3. A device as claimed in claim 1, wherein the additional input impedances implements a respective additional phase shift, each specific one of the additional phase shifts for a specific one of the additional amplifiers being larger by 90° than the additional phase shift of a previous one of the additional amplifiers stages in the device, the additional amplifiers being indexed by the natural numbers from 2 to n.

4. A device as claimed in claim 1, wherein the first phase splitter is coupled to the respective further phase splitters via a respective dual driver.

* * * * *